(12) United States Patent
Kumada et al.

(10) Patent No.: US 7,030,007 B2
(45) Date of Patent: Apr. 18, 2006

(54) VIA-FILLING MATERIAL AND PROCESS FOR FABRICATING SEMICONDUCTOR INTEGRATED CIRCUIT USING THE MATERIAL

(75) Inventors: Teruhiko Kumada, Tokyo (JP); Toshiyuki Toyoshima, Tokyo (JP); Hideharu Nobutoki, Tokyo (JP); Takeo Ishibashi, Tokyo (JP); Yoshiharu Ono, Tokyo (JP); Junjiro Sakai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 85 days.

(21) Appl. No.: 10/623,772

(22) Filed: Jul. 22, 2003

(65) Prior Publication Data

US 2005/0101123 A1    May 12, 2005

(30) Foreign Application Priority Data

Sep. 20, 2002  (JP)  ............... 2002-274300
Feb. 12, 2003  (JP)  ............... 2003-033316

(51) Int. Cl.
*H01L 21/47*    (2006.01)
(52) U.S. Cl. ................................. 438/637
(58) Field of Classification Search ........ 438/622–624, 438/636–640
See application file for complete search history.

(56) References Cited

U.S. PATENT DOCUMENTS

| 6,319,815 B1 | 11/2001 | Iguchi et al. |
| 2001/0008802 A1 | 7/2001 | Nishizawa |
| 2001/0027002 A1* | 10/2001 | Matsumoto ................. 438/584 |
| 2002/0076642 A1* | 6/2002 | Zampini et al. .......... 430/270.1 |
| 2003/0072947 A1* | 4/2003 | Lee et al. .................... 428/421 |
| 2003/0146416 A1* | 8/2003 | Takei et al. ................. 252/500 |
| 2003/0227090 A1* | 12/2003 | Okabe .......................... 257/760 |
| 2004/0072420 A1* | 4/2004 | Enomoto et al. .......... 438/636 |
| 2004/0185656 A1* | 9/2004 | Ramachandrarao et al. ......................... 438/637 |

FOREIGN PATENT DOCUMENTS

| JP | 5-129251 | 5/1993 |
| JP | 2000-195955 | 7/2000 |
| JP | 2001-203207 | 7/2001 |

* cited by examiner

*Primary Examiner*—Laura M. Schillinger
*Assistant Examiner*—Jennifer M. Dolan
(74) *Attorney, Agent, or Firm*—Leydig, Voit & Mayer, Ltd.

(57) ABSTRACT

A via-filling material includes a polymer containing a repeating unit represented by

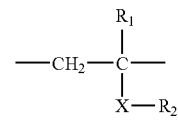

wherein $R_1$ one of hydrogen, fluorine, chlorine, bromine, and methyl group; $R_2$ is one of hydrogen, a $C_{1-3}$ alkyl group, and a $C_{1-4}$ alkyl group in which the hydrogen is replaced by at least one of fluorine, chlorine, and bromine; and X is —C(=O)O— or —S(=O)$_2$O—. This via-filling material does not generate deposits around an opening of a via hole during plasma etching and provides a semiconductor integrated circuit with high reliability, even when a trench wider than the via hole is formed by plasma etching around the via hole filled with the via-filling material.

6 Claims, 3 Drawing Sheets

VIA-FILLING MATERIAL AND PROCESS FOR FABRICATING SEMICONDUCTOR INTEGRATED CIRCUIT USING THE MATERIAL

FIELD OF THE INVENTION

The present invention relates to a via-filling material deposited in a via hole when fabricating a multi-layered wiring structure in accordance with a dual damascene process and a process for fabricating a semiconductor integrated circuit using the via-filling material.

BACKGROUND OF THE INVENTION

Conventionally, polysilicon or aluminum has been widely used for forming interconnections in a semiconductor integrated circuit but now there is the need for materials having further reduced resistance, which can replace such polysilicon or aluminum materials in order to accomplish high performance and micropatterns necessary for high-speed data transmission in semiconductor integrated circuits.

For this purpose, forming metal lines of the semiconductor integrated circuit by using copper instead of aluminum used in the past has been attempted. However, patterning by dry etching as employed when forming the conventional aluminum connection is difficult with copper and also the corrosion resistance of copper is inferior. So as a process for fabricating semiconductor integrated circuit comprising metal lines inside and on the surface of the inter-layer film and contacts connecting these metal lines, both of which are made of copper, a process called dual damascene process has now been developed.

In the conventional process of fabricating semiconductor integrated circuit according to dual damascene technique based on the via-first approach, via holes are first formed through the upper $SiO_2$ inter-layer film to the stopper film at the position where metal line is located below. Thereafter, the via holes are filled with a via-filling material such as an organic film and trenches of a certain width are formed in a depth which does not reach the stopper film.

As the organic film, ARC (Anti Reflective Coating), specifically a composition obtained by adding poly(vinyl phenol) or poly(methyl methacrylate) to a base resin comprising polyimide and novolak is used (see for example, JP-A-2001-203207).

Also, as the via-filling material deposited in the via hole, photoresist materials, melamine derivatives, guanamine derivatives, glycoluril derivatives, urea derivatives and succinyl amide derivatives are used (see for example, JP-A-2000-195955).

Figure 3:
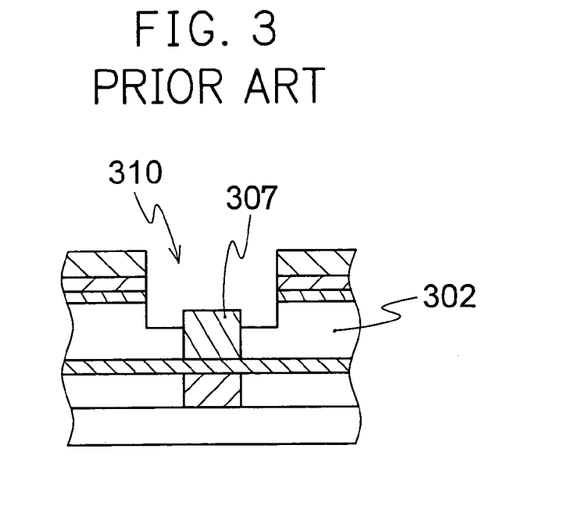
FIG. 3 is a cross-sectional view illustrating a protrusion of the via-filling body.

In the conventional dual damascene process, the organic materials mentioned above are used as the via-filling material filling the via holes. However, when plasma etching the upper inter-layer film and the via-filling material in order to form a trench, via-filling material 307 protrudes from upper inter-layer film 302 within trench 310 as shown in FIG. 3, because the etching rate of the via-filling material is lower than the etching rate of the upper inter-layer film.

Figure 4:
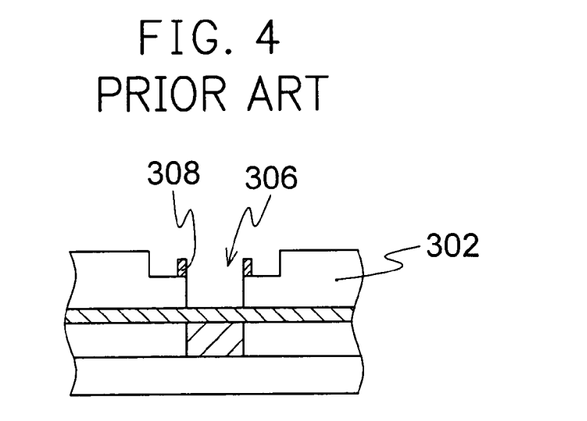
FIG. 4 is a cross-sectional view illustrating deposition around a via hole.

Furthermore, when $C_4F_8$ is used as an etching gas, fluorocarbon deposition is easily generated from the decomposition in plasma or reaction products. Such deposition often sticks to the protruding via-filling material and prevents downward plasma etching because the deposition serves as a mask. Accordingly, when the via-filling material in the via hole is removed after completing the simultaneous etching of the upper inter-layer film and via-filling material, a deposit 308 which is chemically stable and hard to decompose remains in the opening part of via hole 306 as shown in FIG. 4.

When a deposit remains in the opening of via hole, metal lines in the upper layer cannot be formed well, leading to the problem of disconnection in the fabricated semiconductor integrated circuit.

SUMMARY OF THE INVENTION

The present invention has been made in order to solve the above problems and the first object of the present invention is to obtain an organic via-filling material which has a higher etching rate than the upper inter-layer film and thus does not protrude from the upper inter-layer film within the formed trench even in the case of etching the via-filling body obtained by filling and solidifying the via-filling material in a via hole and insulating films such as upper inter-layer film in the dual damascene process.

The second object of the present invention is to provide a process for fabricating a semiconductor integrated circuit in which the step of removing deposition is unnecessary because deposition does not remain in the opening part of the via hole, and by which upper metal lines can be formed well without causing disconnection or the like.

The via-filling material of the present invention is used to fill a via hole in the insulating film previously where a trench wider than the via hole is formed by conducting plasma etching, the material comprising a polymer containing a repeat unit represented by the following formula (1):

wherein $R_1$ is a member selected from the group consisting of hydrogen atom, fluorine atom, chlorine atom, bromine atom and methyl group; $R_2$ is a member selected from the group consisting of hydrogen atom, $C_{1-3}$ alkyl group and $C_{1-4}$ alkyl group in which the hydrogen atom is substituted by at least one kind of atoms of fluorine, chlorine and bromine atom; and X is —C(=O)O— or —S(=O)$_2$O—.

Preferably, the polymer constituting the via-filling material of the present invention has a weight average molecular weight of 1,000 to 200,000.

The via-filling material of the present invention comprises a copolymer of a first monomer and a second monomer, the first monomer being represented by the formula (2):

wherein $R_1$ is a member selected from the group consisting of hydrogen atom, fluorine atom, chlorine atom, bromine atom and methyl group; $R_2$ is a member selected from the group consisting of hydrogen atom, $C_{1-3}$ alkyl group and $C_{1-4}$ alkyl group in which the hydrogen atom is substituted by at least one kind of atoms of fluorine, chlorine and bromine atoms; and X is —C(=O)O— or —S(=O)₂O—; and the second monomer contains an unsaturated group which brings about a copolymerization reaction with the first monomer and a functional group capable of crosslinking the prepared copolymer.

The first process for fabricating a semiconductor integrated circuit of the present invention comprises the steps of: forming a stopper film on the surface of a lower insulating film on which a first conductor is formed and laminating an upper insulating film on the stopper film; forming a via hole leading from the surface of the upper insulating film to the surface of the stopper film at the position where the first conductor is located below; applying any of the via-filling materials of the present invention on the surface of the upper insulating film to fill the via hole with the via-filling material; forming a resist pattern defining an opening part including the via hole on the applied film made of a via-filling body obtained by solidifying the via-filling material; forming a trench of a depth which does not reach the stopper film in the upper insulating film by dry etching the upper insulating film and the via-filling body using the resist pattern as a mask; removing the resist pattern, the applied film made of via-filling body and the via-filling body remaining in the via hole and etching the stopper film appeared on the bottom of the via hole, thereby exposing the first conductor; and forming a second conductor in the trench and the via hole.

The second process for fabricating a semiconductor integrated circuit comprises the steps of: forming an insulating film on a substrate; forming a via hole in the insulating film; applying any of the via-filling materials of the present invention on the surface of the insulating film to fill the via hole with the via-filling material; forming a resist pattern defining an opening part including the via hole on the applied film made of a via-filling body obtained by solidifying the via-filling material; forming a trench of a depth which does not reach the substrate in the insulating film by dry etching the insulating film and the via-filling body using the resist pattern as a mask; removing the resist pattern, applied film made of via-filling body and the via-filling body remaining in the via hole; and forming a conductor in the trench and the via hole.

BRIEF DESCRIPTION OF THE DRAWINGS

FIGS. 1(a)–1(k) are cross-sectional views illustrating the steps of fabricating a semiconductor integrated circuit of Embodiment 1 using the via-filling material according to a via-first dual damascene process.

DETAILED DESCRIPTION

Embodiment 1

FIG. 1 is a cross-sectional view illustrating the steps of fabricating a semiconductor integrated circuit of Embodiment 1 using the via-filling material of the present invention, according to the via-first dual damascene process.

Referring to FIG. 1, lower insulating film 104 is formed on semiconductor substrate 100 and lower metal line 105 which is the first conductor is buried in this lower insulating film 104. Then upper insulating film 102 is laminated on the surface of lower insulating film 104 and metal line 105, interposing etching stopper film 103 therebetween (FIG. 1(a)).

In this embodiment, SiOC is used for lower insulating film 104 and upper insulating film 102 while silicone oxide insulating materials such as $SiO_2$ and SiOF or organic spin-on-glass insulating materials such as SilK (available from Dow-Chemical Co. Ltd.) can also be used. On the other hand, silicone nitride films such as SiN and SiON are used for etching stopper film 103.

Figure 1B:
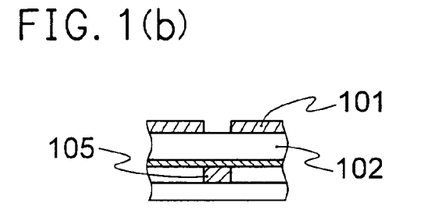

As the next step, according to a usual photolithographic method, resist pattern 101 having a hole at the position where lower metal line 105 is located below is formed by using a commercially available photosensitive photoresist on upper insulating film 102 (FIG. 1 (b)). The formation of resist pattern 101 here is not particularly limited and the type of resist and photolithographic technique are selected depending on the resist dimensions required. For example, novolak-naphthoquinone i-ray resist materials or chemically amplified resist materials sensitized within a wavelength of KrF excimer, ArF excimer and $F_2$ excimer can be used. EB (electron beam) resist materials and X-ray resist materials can also be used.

Figure 1C:
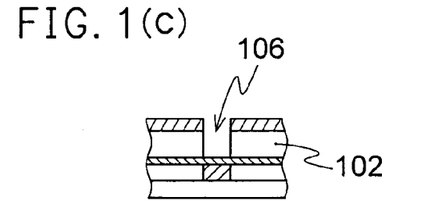
Figure 1D:
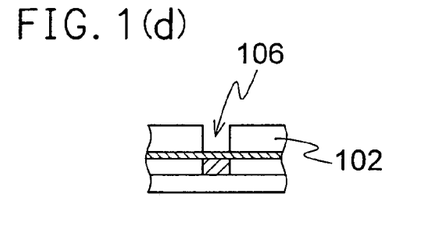

Next, via hole 106 is created in upper insulating film 102 by dry etching upper insulating film 102 (FIG. 1(c)) and resist pattern 101 is removed by peeling (FIG. 1(d)). Dry etching is conducted by using a gas containing a fluorine gas such as $CHF_3$ or $C_4F_8$ as a main component but as another etching gas, a mixed gas of $HF_3/CF_4/O/Ar$ can also be used. To remove resist pattern 101, $O_2$ ashing and cleaning with organic amine are conducted.

Figure 1E:
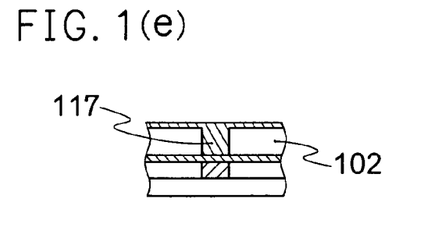

Thereafter, via hole 106 is filled with via-filling material 117. More specifically, via hole 106 is filled with via-filling material 117 and leveled (FIG. 1(e)) by dropping and spin-coating on semiconductor substrate 100 which has an insulating film with via hole 106, a solution obtained by dissolving in an organic solvent a polymer containing a repeat unit represented by the formula (1):

(wherein $R_1$ is a member selected from the group consisting of hydrogen atom, fluorine atom, chlorine atom, bromine atom and methyl group; $R_2$ is a member selected from the group consisting of hydrogen atom, $C_{1-3}$ alkyl group and $C_{1-4}$ alkyl group in which the hydrogen atom is substituted by at least one kind of atoms of fluorine, chlorine and bromine atom; and X is —C(=O)O— or —S(=O)₂O—).

The repeat number "n" of the repeat unit of the polymer is preferably 5 to 1,000. When n is less than 5, film formability decreases while when n is more than 1,000, the viscosity of the polymer solution increases and the thickness of the via-filling material remaining on insulating film 102 becomes large, necessitating extra steps of removing by polishing or etching back.

The weight average molecular weight of the polymer is preferably 1,000 to 200,000. When the weight average molecular weight is less than 1,000, crack is generated in the via-filling body formed after baking. When the weight average molecular weight is more than 200,000, the solubility of the polymer in solvents decreases and a solution having a required concentration cannot be obtained.

The concentration of the solution obtained by dissolving the polymer in an organic solvent is preferably 3 to 20% by weight. When the concentration of the solution is less than 3% by weight, the via hole cannot be filled with the via-filling material uniformly. When the concentration of the solution is more than 20% by weight, the viscosity of the solution becomes high and the via-filling material remaining on insulating film 102 becomes thick, necessitating extra steps of removing by polishing.

Next, the applied via-filling material 117 is solidified by pre-baking at 80 to 100° C. for 90 to 180 seconds and baking at 180 to 230° C. for 50 to 90 seconds to form via-filling body 107. Then, for example, an antireflection coating for ArF lithography (available from Clariant Japan KK) 108 is applied on this via-filling body 107 existing on and leveling off upper insulating film 102 by spin-coating and baked to form into a film (FIG. 1(f)). The material of the antireflection coating is not limited to the above material and commercially available antireflection coatings can be used.

Figure 1F:
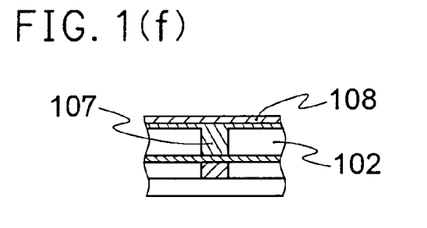
Figure 1G:
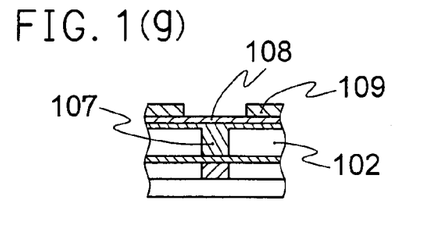

Thereafter, an ArF-ecximer resist (available from Tokyo Oka Co., Ltd.) for example, was spin-coated on antireflection coating 108 and according to a usual photolithographic method, resist pattern 109 which serves as a mask when plasma etching is formed (FIG. 1(g)). The photosensitive resist used here is not limited to the above material and various resist materials including resists for g-ray, i-ray, KrF-excimer, $F_2$-excimer, EB (electron beam), X-ray and E-UV (extreme-UV) can be used depending on the dimension of pattern to be formed.

Figure 1H:
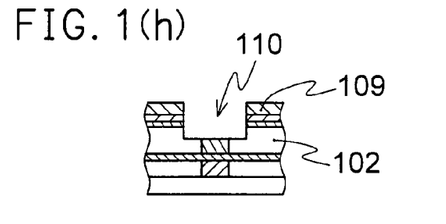

In the next step, plasma etching is conducted with formed resist pattern 109 as an etching mask to create trench 110 in the upper part of upper insulating film 102 (FIG. 1(h)). In plasma etching, the etching device used when etching usual SiOC film is employed and etching is conducted by using a gas containing a fluorine gas such as $CF_4$ as a main component under a pressure of 20 to 150 mTorr.

In this embodiment, the polymer having a repeat unit represented by the formula (1) is used as via-filling material 117 in via hole 106 and thus when etching SiOC of upper insulating film 102, the etching rate of via-filling body 107 obtained from this via-filling material 117 is the same or higher than that of upper insulating film 102. Therefore, in via-filling body 107, thickness reduction occurs at the same rate or faster than the reduction of upper insulating film 102. For these reasons, via-filling body 107 does not protrude from upper insulating film 102 in formed trench 110 and deposition from the decomposition in plasma or reaction products is not formed because via-filling body 107 is not protruded. In addition, downward etching of upper insulating film 102 is not prevented because there is no deposition and trench 110 can be formed well.

Figure 1I:
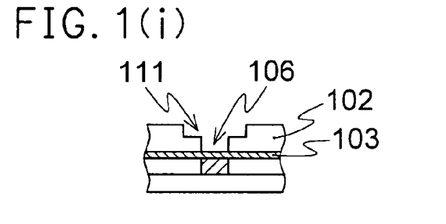

Next, remaining resist pattern 109, anti-reflection coating 108 and via-filling body 107 are removed and cleaned by $O_2$ plasma ashing and amine organic peeling solution to expose via hole 106 and upper wiring trench 111 in upper insulating film 102 (FIG. 1(i)).

Figure 1J:
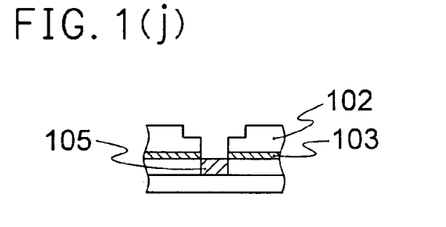
Figure 1K:
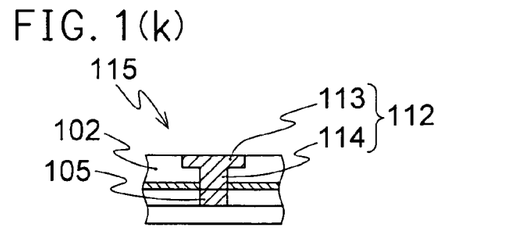

By using a mixed etching gas of $CHF_3$, $O_2$ and inert gas Ar, stopper film 103 located at the bottom of via hole 106 is subjected to plasma etching with upper insulating film 102 as a mask and lower metal line 105 is exposed (FIG. 1(j)).

Then after cleaning the surfaces of upper insulating film 102 and lower metal line 105 by using a remover of amine based organic solution, a copper film was formed by sputtering in via hole 106 and upper wiring trench 111. When necessary, a film of tantalum nitride can also be formed before forming copper sputtering layer in order to prevent copper from diffusing. Thereafter copper is further applied by plating to form second conductor 112 made of copper. This second conductor 112 comprises upper metal line 113 and inter-layer connection 114 and thus semiconductor integrated circuit 115 is completed (FIG. 1(k)).

In the process for fabricating a semiconductor integrated circuit of this embodiment, the polymer having a repeat unit represented by the formula (1) is used as via-filling material 117 in via hole 106. Therefore, the via-filling body 107 obtained from via-filling material 117 does not protrude from upper insulating film 102 and deposition which is chemically stable and hard to decompose are not formed even if upper insulating film 102 and via-filling body 107 are etched simultaneously by plasma etching. Therefore, the flaw of deposition remaining in the opening part of via hole 106 after removing via-filling body 107 within via hole 106 does not occur. This eliminates the need for the extra steps of removing deposition chemically stable and hard to decompose which possibly causes a damage to interconnections in a semiconductor integrated circuit. Furthermore, upper metal line 113 can be formed well when upper wiring trench 111 is filled with second conductor 112 made of copper and therefore disconnection due to faulty formation of upper metal line 113 can be prevented, making it possible to obtain a semiconductor integrated circuit with high reliability.

In this embodiment, anti-reflection coating 108 is formed on the via-filling body 107 formed when leveling upper insulating film 102 by filling via hole 106 with via-filling material 117. However, similar effect can be found and semiconductor integrated circuit with high reliability can also be obtained even by forming resist pattern 109 directly on the film of via-filling body without applying this anti-reflection coating 108 and by etching upper insulating film 102 and via-filling body 107 together using this resist pattern 109 as a mask.

Embodiment 2

FIG. 2 is a cross-sectional view illustrating the steps of fabricating a semiconductor integrated circuit of Embodiment 2 using the via-filling material of the present invention, according to the via-first dual damascene process.

Figure 2A:
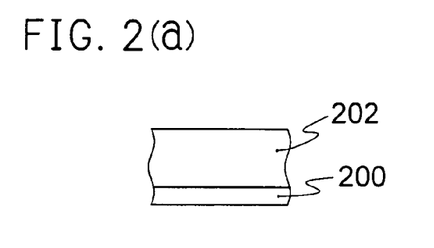
FIGS. 2(a)–2(i) are cross-sectional views illustrating the steps of fabricating a semiconductor integrated circuit of Embodiment 2 using the via-filling material according to a via-first dual damascene process.
Figure 2B:
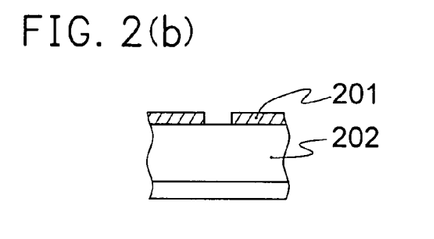
Figure 2C:
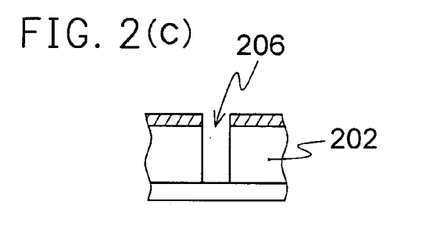
Figure 2D:
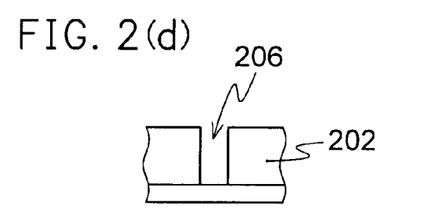
Figure 2E:
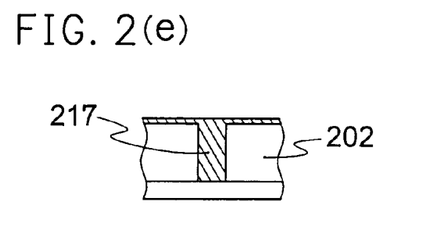

In FIG. 2, insulating film 202 is formed on semiconductor substrate 200 (FIG. 2(a)) and resist pattern 201 is formed on this insulating film 202 (FIG. 2(b)). Via hole 206 is created in insulating film 202 (FIG. 2(c)), followed by removal of resist pattern 201 (FIG. 2(d)). Thereafter via hole 206 is filled with via-filling material 217 (FIG. 2(e)). The via-filling material 217 used here is the same as that used in Embodiment 1.

Figure 2F:
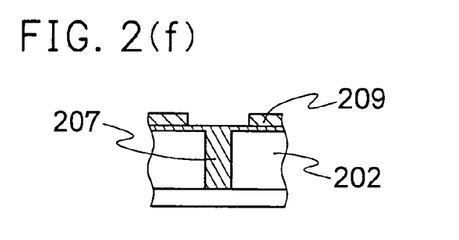
Figure 2G:
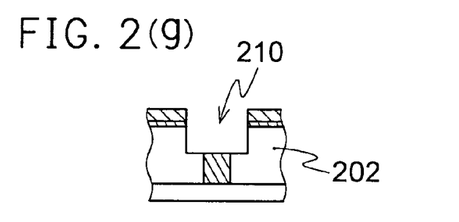
Figure 2H:
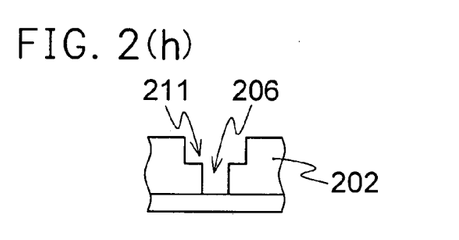
Figure 2I:
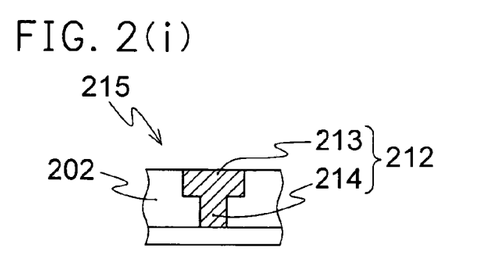

Next, resist pattern 209 is formed on the via-filling body 207 obtained by solidifying via-filling material 217 existing on and leveling off insulating film 202 (FIG. 2(f)), insulating film 202 and via-filling body 207 are subjected to plasma etching with this resist pattern 209 as an etching mask and trench 210 is created in the upper part of insulating film 202 (FIG. 2(g)). Then remaining resist pattern 209 and via-filling body 207 are removed and cleaned to expose via hole 206 and wiring trench 211 (FIG. 2(h)). Subsequently, via hole 206 and wiring trench 211 are filled with conductor of copper 212. This conductor 212 comprises metal line 213 and inter-layer connection 214 and thus semiconductor integrated circuit 215 is completed (FIG. 2(i)).

The material and method employed in this embodiment are the same as those in Embodiment 1. The effect similar to that of Embodiment 1 is found and semiconductor integrated circuit with high reliability can be obtained.

Embodiment 3

This embodiment is carried out in the same manner as in Embodiment 1 except for using as via-filling material 117 a material comprising a copolymer of the first monomer represented by the formula (2):

(2)

wherein $R_1$ is a member selected from the group consisting of hydrogen atom, fluorine atom, chlorine atom, bromine atom and methyl group; $R_2$ is a member selected from the group consisting of hydrogen atom, $C_{1-3}$ alkyl group and $C_{1-4}$ alkyl group in which the hydrogen atom is substituted by at least one kind of atoms of fluorine, chlorine and bromine atoms; and X is —C(═O)O— or —S(═O)$_2$O—, and the second monomer which is an unsaturated compound containing an unsaturated group which brings about a copolymerization reaction with the first monomer and a functional group capable of crosslinking the copolymer.

In this embodiment, an unsaturated compound containing at least two unsaturated groups is particularly used as the second monomer.

Examples of the unsaturated compound containing at least two unsaturated groups are ester compounds obtained by condensing a carboxylic acid containing an unsaturated group or sulfonic acid containing an unsaturated group and alcohol containing an unsaturated group.

Concrete examples of the carboxylic acid containing an unsaturated group or sulfonic acid containing an unsaturated group are acrylic acid, methacrylic acid, α-fluoroacrylic acid, α-chloroacrylic acid, α-bromoacrylic acid and vinyl sulfonic acid. Concrete examples of the alcohol containing an unsaturated group are vinyl alcohol, allyl alcohol, isopropenyl alcohol, propagyl alcohol, 1,1-dimethyl-2-propenyl alcohol and 1,1-dimethyl-2-propinyl alcohol.

The above copolymer is synthesized by polymerization reaction between the double bond in the first monomer and the unsaturated bond in the second monomer by heat or light. At this stage, at least one of the unsaturated groups existing in the unsaturated compound containing at least two unsaturated groups, which is the second monomer, should remain in the copolymer.

In the above copolymer, when the number of the structural unit derived from the first monomer is assumed to be $X_1$ and the number of the structural unit derived from the second monomer, i.e., unsaturated compound, is assumed to be $X_2$, the composition ratio $X_1/X_2$ is preferably in the range of 98/2 to 70/30.

In this embodiment, the copolymer used for the via-filling material contains at least 70% of the structural unit derived from the first monomer and therefore, thickness reduction in via-filling body 107 obtained from the via-filling material occurs at the same rate or faster than the reduction of upper insulating film 102 when upper insulating film 102 is etched in the preparation of semiconductor integrated circuit according to the dual damascene process shown in FIG. 1. For this reason, via-filling body 107 does not protrude from upper insulating film 102 in formed trench 110 and deposition from the decomposition in plasma or reaction products is not formed. In addition, downward etching of upper insulating film 102 is not prevented because there is no deposition and thus trench 110 can be formed well.

In some cases, mixing of anti-reflection coating 108 and part of via-filling body 107 may occur in the step (f) of the process for preparing semiconductor integrated circuit shown in FIG. 1. It occurs when anti-reflection coating 108 is applied and heat-treated to form a film, particularly when heat-treating at a temperature of 180° C. or higher in order to improve the anti-reflection property. However, in this embodiment, crosslinking reaction occurs in via-filling material 117 when via hole 106 is filled with via-filling material 117 and heating is conducted because the copolymer used for the via-filling material 117 contains at least 2% of the structural unit derived from the second monomer which is an unsaturated compound containing at least two unsaturated groups and some of these unsaturated groups remain in the copolymer.

That is, in this embodiment, mixing of anti-reflection coating 108 and via-filling body 107 can be prevented even if the applied anti-reflection coating 108 is heat-treated at 180° C. or higher, because the via-filling material 107 is in crosslinked state and therefore, decrease in dimensional accuracy of resist wiring pattern 109 caused by mixing of anti-reflection coating and via-filling body 107 can be prevented.

Accordingly, upper wiring trench 111 can be formed well, disconnection caused by faulty formation of upper metal line 113 can be prevented and semiconductor integrated circuit with high reliability can be prepared also by the process for preparing semiconductor integrated circuit using the via-filling material of this embodiment.

Embodiment 4

This embodiment is carried out in the same manner as in Embodiment 3 except for using a copolymer in which the second monomer is unsaturated compound containing an unsaturated group and epoxy group as via-filling material 117.

Examples of the unsaturated compound containing an unsaturated group and epoxy group are esters of an acrylic acid selected from acrylic acid, methacrylic acid and α-halo acrylic acid, and glycidyl alcohol.

In this embodiment, the copolymer also contains at least 70% of the structural unit derived from the first monomer and therefore, when upper insulating film 102 is etched in the preparation of semiconductor integrated circuit according to the dual damascene process, via-filling body 107 does not protrude from upper insulating film 102 in formed trench 110 and deposition from the decomposition in plasma or reaction products is not formed. Accordingly, downward etching of upper insulating film 102 is not prevented and thus trench 110 can be formed well.

In this embodiment, crosslinking reaction occurs in via-filling material 117 when via hole 106 is filled with via-filling material 117 and heat treatment is conducted because the copolymer used for the via-filling material 117 contains at least 2% of the structural unit derived from the second monomer which is an unsaturated compound containing an unsaturated group and epoxy group and epoxy group is present in the copolymer.

That is, in this the embodiment, mixing of anti-reflection coating 108 and via-filling body 107 can be prevented even if the anti-reflection coating 108 is heat-treated at 180° C. or higher and therefore, decrease in dimensional accuracy of resist pattern 109 caused by mixing of anti-reflection coating 108 and via-filling body 107 can be prevented.

Accordingly, upper wiring trench 111 can be formed well, disconnection caused by faulty formation of upper metal line 113 can be prevented and semiconductor integrated circuit with high reliability can be prepared also by the process for preparing semiconductor integrated circuit using the via-filling material of this embodiment.

Embodiment 5

This embodiment is carried out in the same manner as in Embodiment 3 except for using a mixture of the copolymer used in Embodiment 3 and an unsaturated compound containing at least two unsaturated groups as the via-filling material.

Examples of the unsaturated compound containing at least two unsaturated groups in this embodiment are ester compounds obtained by the reaction between a compound selected from multifunctional alcohols and multifunctional thiols such as ethylene glycol, diethylene glycol, triethylene glycol, propylene glycol, glycerin, pentaerythritol, mercapto ethanol, ethylene dithiol, and thiodiethanol and one organic acid containing an unsaturated group selected from acrylic acid, methacrylic acid, α-fluoroacrylic acid, α-chloroacrylic acid, α-bromoacrylic acid and vinyl sulfonic acid.

In this embodiment, a catalyst which promote the reaction of unsaturated group may also be added to the mixture of the copolymer and the unsaturated compound containing at least unsaturated groups. Examples of the catalyst is azo nitrile compound such as 2,2'-azobisisobutylonitrile, azo amide compound such as 2,2'-azobis(N-butyl-2-methylpropion amide), alkyl azo compound such as azodi-tert-octane, and peroxide compound such as benzyl peroxide.

In this embodiment, the content of unsaturated compound containing at least two unsaturated groups in the via-filling material is preferably at most 25% by weight. When the amount is more than 25% by weight, the etching rate of via-filling body 107 becomes lower than the etching rate of upper insulating film 102.

Since the same copolymer that in Embodiment 3 is used in this embodiment, the effect similar to that of Embodiment 3 can be obtained. That is, trench 110 can be formed well when etching upper insulating film 102 and the decrease of dimensional accuracy of resist pattern 109 is prevented by controlling the mixing of anti-reflection coating 108 and via-filling body 107.

In addition, this embodiment is free from the trouble of voids being generated by faulty filling even if via hole 106 having an aspect ratio of at least 4 or a pore size of at most 0.15 μm is filled with via-filling material 117, because the unsaturated compound containing at least two unsaturated groups is mixed to the via-filling material 117 and the flowability of the via-filling material 117 is improved. Moreover, since the unsaturated compound mixed to the via-filling material 117 has at least two unsaturated groups, crosslinking reaction occurs by heat treatment conducted after the via-filling material 117 is filled in via hole 106 and then molecular weight increases infinitely. At the same time the unsaturated compound reacts with copolymer to create crosslinking, making it possible to prevent mixing of anti-reflection coating 108 and via-filling body 107.

Accordingly, upper wiring trench 111 can be formed well, disconnection caused by faulty formation of upper metal line 113 can be prevented and semiconductor integrated circuit with high reliability can be prepared also by the process for preparing semiconductor integrated circuit using the via-filling material of this embodiment.

Embodiment 6

This embodiment is carried out in the same manner as in Embodiment 4 except for using a mixture of the copolymer used in Embodiment 4 and an epoxy compound containing at least two epoxy groups as the via-filling material.

Examples of the epoxy compound containing at least two epoxy groups is bisphenol A diglycidyl ether and trisphenol triglycidyl ether.

In this embodiment, the content of epoxy compound containing at least two epoxy groups in the via-filling material is preferably at most 25% by weight. When the amount is more than 25% by weight, the etching rate of via-filling body 107 becomes lower than the etching rate of upper insulating film 102.

In this embodiment, the same copolymer as in Embodiment is used and therefore, the effect similar to that of Embodiment 4 can be obtained. That is, trench 110 can be formed well when etching upper insulating film 102 and the decrease of dimensional accuracy of resist wiring pattern 109 is prevented by controlling the mixing of anti-reflection coating 108 and via-filling body 107.

In addition, this embodiment is free from the trouble of voids being generated by faulty filling even if via hole 106 having an aspect ratio of at least 4 or a pore size of at most 0.15 μm is filled with via-filling material 117, because the epoxy compound containing at least two epoxy groups is mixed to the via-filling material 117, this epoxy compound containing at least two epoxy groups is an oligomer having an average repeat number of at most 2 and because the flowability of the via-filling material 117 is improved. Moreover, since the epoxy compound mixed to the via-filling material 117 has at least two epoxy groups, crosslinking reaction occurs by heat treatment conducted after the via-filling material 117 is filled in via hole 106 and then molecular weight increases infinitely. At the same time epoxy compound reacts with copolymer to create crosslinking, making it possible to prevent mixing of anti-reflection coating 108 and via-filling body 107.

Accordingly, upper wiring trench 111 can be formed well, disconnection caused by faulty formation of upper metal line 113 can be prevented and semiconductor integrated circuit with high reliability can be prepared also by the process for preparing semiconductor integrated circuit using the via-filling material of this embodiment.

Embodiment 7

This embodiment is carried out in the same manner as in Embodiment 3 except for using a via-filling material comprising a mixture obtained by mixing a compound selected from melamine compounds containing at least two methoxymethyl groups, urea compounds containing at least two methoxymethyl groups and epoxy compounds containing at least two epoxy groups to a copolymer of the first monomer and the second monomer which is an unsaturated compound having a functional group selected from hydroxyl group, carboxyl group and dicarboxylic anhydride group.

In this embodiment, examples of the unsaturated compound having a functional group selected from hydroxyl group, carboxyl group and dicarboxylic anhydride group are esters of an acrylic acid selected from acrylic acid, methacrylic acid and α-halo acrylic acid, and ethylene glycol or propylene glycol; maleic acid; N-hydroxymaleimide and the like.

In this embodiment, examples of the melamine compound containing at least two methoxymethyl groups are hexakis-methoxymethyl melamine and examples of urea compound containing at least two methoxymethyl groups are bis-methoxymethyl ethylene urea. Examples of the epoxy compound containing at least two epoxy groups are bisphenol A diglycidyl ether and trisphenol triglycidyl ether.

In this embodiment, the content of the compound mixed with the copolymer is at most 25% by weight in the via-filling material. When the amount is more than 25% by weight, the etching rate of via-filling body 107 becomes lower than the etching rate of upper insulating film 102.

In this embodiment, the copolymer used in the via-filling material contains at least 70% of the structural unit derived from the first monomer and therefore, when etching upper insulating film 102, trench 110 can be formed well.

Furthermore, this embodiment is free from the trouble of voids being generated by faulty filling even if via hole 106 having an aspect ratio of at least 4 or a pore size of at most 0.15 μm is filled with via-filling material 117, because a compound selected from melamine compound containing at least two methoxymethyl groups, urea compound containing at least two methoxymethyl groups and epoxy compound containing at least two epoxy groups is mixed to the via-filling material 117 and the flowability of the via-filling material 117 is improved.

In addition, since the copolymer contains at least 2% of the structural unit derived from the second monomer, any of the functional groups of hydroxyl group, carboxyl group and dicarboxylic anhydride group are present in the copolymer. Thus when via hole 106 is filled with via-filling material 117 and heat treated, these functional groups react with the compound selected from melamine compound containing at least two methoxymethyl groups, urea compound containing at least two methoxymethyl groups and epoxy compound containing at least two epoxy groups to crosslink via-filling material 117.

That is, in this embodiment, mixing of anti-reflection coating 108 and via-filling body 107 can be prevented even if the applied anti-reflection coating 108 is heat-treated at 180° C. or higher and therefore, decrease in dimensional accuracy of resist pattern 109 caused by mixing of anti-reflection coating 108 and via-filling body 107 can be prevented.

Accordingly, upper wiring trench 111 can be formed well, disconnection caused by faulty formation of upper metal line 113 can be prevented and semiconductor integrated circuit with high reliability can be prepared also by the process for preparing semiconductor integrated circuit using the via-filling material of this embodiment.

In the followings, the present invention is explained in more detail based on Examples.

EXAMPLE 1

The etching rate of widely used insulating film materials such as SiOC, $SiO_2$, SiOF and SilK, was measured in the following manner.

Insulating film of SiOC, $SiO_2$ or SiOF was formed on a silicone wafer in a thickness of 1,000 nm by the CVD method. Also, insulating film of SilK spin-on-glass material was formed on a silicone wafer in a thickness of 1,000 nm by spin coating.

Each insulating film prepared in this way was subjected to plasma etching by using a mixed etching gas of $C_4F_8/O_2/Ar=8/20/400$ sccm under the condition of an RF power of 600 W and a pressure of 300 mTorr and etching rate was measured. The results are shown in Table 1.

Secondly, a film of via-filling body was formed by using the via-filling material of the present invention as described below.

A polymer in which the repeat unit is represented by the formula (1), the repeat number (n) of repeat unit is 50 and each group, i.e., X is —C(=O)O—, $R_1$ is Cl and $R_2$ is $CH_3$, was dissolved in a solvent to prepare a 7% solution. This solution was applied to a silicon wafer by the spin coating method and baked and the via-filling body of 1,000 nm in thickness was formed.

The film of the via-filling body prepared in this way was subjected to plasma etching under the same condition as that in the case of the above insulating film, and etching rate was measured. The results are shown in Table 2.

EXAMPLES 2 to 15

The via-filling body was prepared by using the polymer having the same "n" and molecular structure as those in Example 1 except that each of X, $R_1$ and $R_2$ was as shown in the column Ex. 2 to 15 of Table 2. The film of the via-filling body was subjected to plasma etching under the same condition as that in the case of the above insulating film and the etching rate was measured. The results are shown in Table 2.

COMPARATIVE EXAMPLES 1 to 6

Polymethyl methacrylate (PMMA) resin, antireflection coating (DUV: available from Nissan Chemical Industries, Ltd. and AZ KrF-16: available from Clariant Japan KK), KrF resist (PEK-112: available from JSR Corporation), novolak resin and methoxymethylated benzoguanamine which are conventional via-filling materials were respectively formed into a film of 1000 nm in thickness on a silicon wafer by spin coating. Each of these films was subjected to plasma etching under the same condition as that in the case of the above insulating film and the etching rate was measured. The results are shown in Table 3.

TABLE 1

| Insulating film | Etching rate (nm/min) |
|---|---|
| SiOC | 205 |
| $SiO_2$ | 134 |
| SiOF | 148 |
| SilK (available from Dow-Chemical Co. Ltd.) | 210 |

TABLE 2

| | Group of via-filling material | | | Etching rate |
|---|---|---|---|---|
| | X | $R_1$ | $R_z$ | (nm/min) |
| Ex. 1 | C(=O)O | Cl | $CH_3$ | 213 |
| Ex. 2 | C(=O)O | Cl | $C_2H_5$ | 211 |
| Ex. 3 | C(=O)O | Cl | $CH_2CF_3$ | 253 |

TABLE 2-continued

|  | Group of via-filling material | | | Etching rate |
|---|---|---|---|---|
|  | X | $R_1$ | $R_z$ | (nm/min) |
| Ex. 4 | C(=O)O | Cl | $CH_2CCl_3$ | 342 |
| Ex. 5 | C(=O)O | Cl | $CH_2CBr_3$ | 357 |
| Ex. 6 | C(=O)O | Cl | $C_4F_9$ | 274 |
| Ex. 7 | C(=O)O | Cl | $CH_2CF_2CF_3$ | 285 |
| Ex. 8 | C(=O)O | F | $CH_2CCl_3$ | 282 |
| Ex. 9 | C(=O)O | Br | $CH_2CCl_3$ | 354 |
| Ex. 10 | C(=O)O | $CH_3$ | $CH_2CCl_3$ | 236 |
| Ex. 11 | $S(=O)_2O$ | H | $CH_3$ | 216 |
| Ex. 12 | $S(=O)_2O$ | H | $C_2H_5$ | 212 |
| Ex. 13 | $S(=O)_2O$ | H | $CH_2CF_3$ | 262 |
| Ex. 14 | $S(=O)_2O$ | H | $CH_2CCl_3$ | 330 |
| Ex. 15 | $S(=O)_2O$ | H | $CH_2CBr_3$ | 354 |

TABLE 3

|  | Conventional via-filling material | Etching rate (nm/min) |
|---|---|---|
| Com. Ex. 1 | PMMA resin | 125 |
| Com. Ex. 2 | DUV (available from Nissan Chemical Industries) | 115 |
| Com. Ex. 3 | AZ KrF-16 (available from Clariant Japan KK) | 102 |
| Com. Ex. 4 | KrF resist (PEK-112) | 89 |
| Com. Ex. 5 | Novolak resin (i-ray resist) | 65 |
| Com. Ex. 6 | Methoxymethylated benzoguanamine | 115 |

From comparison of Tables 1 to 3, the etching rate of the via-filling body obtained from the via-filling material of the present invention was found to be higher than etching rate of the insulating film used in the dual damascene process and the etching rate of the conventional via-filling material was found to be lower than the etching rate of the above insulating film.

The via-filling material of the present invention has the effect that the via-filling material does not protrude from the insulating film even when etched at the same time as the insulating film.

EXAMPLES 16 to 30

First, the etching rate of insulating film material SiOC, $SiO_2$, SiOF and SilK which are widely used was measured in the following manner.

Insulating film of each of SiOC, $SiO_2$ and SiOF was formed on a silicon wafer in a thickness of 1,000 nm by the CVD method. Also, insulating film of SilK spin-on-glass material was formed on a silicon wafer in a thickness of 1,000 nm by spin coating.

Each insulating film formed in this way was subjected to plasma etching using mixed etching gas $CHF_3/CF_4/O_2/Ar=50/25/15/300$ sccm, under conditions of an RF power of 400 W and pressure of 45 mTorr and the etching rate was measured. The results are shown in Table 4.

Next, a film of 1000 nm in thickness was formed on a silicon wafer in the same manner as in Examples 1 to 15 using the via-filling material used in Examples 1 to 15. The film of the via-filling body obtained from the via-filling material was subjected to plasma etching using mixed etching gas of $CHF_3/CF_4/O_2/Ar=50/25/15/300$ sccm under conditions of an RF power of 400 W and a pressure of 45 mTorr and the etching rate was measured. The results are shown in Table 5.

COMPARATIVE EXAMPLES 7 to 12

A film of 1,000 nm in thickness was formed on a silicon wafer in the same manner as in Comparative Examples 1 to 6 using the conventional via-filling material used in Comparative Examples 1 to 6. This film of the via-filling body was subjected to plasma etching using mixed etching gas of $CHF_3/CF_4/O_2/Ar=50/25/15/300$ sccm under conditions of an RF power of 400 W and a pressure of 45 mTorr and the etching rate was measured. The results are shown in Table 6.

TABLE 4

| Insulating film | Etching rate (nm/min) |
|---|---|
| SiOC | 340 |
| $SiO_2$ | 218 |
| SiOF | 251 |
| SilK (available from Dow-Chemical Co. Ltd.) | 345 |

TABLE 5

|  | Group of via-filling material | | | Etching rate |
|---|---|---|---|---|
|  | X | $R_1$ | $R_z$ | (nm/min) |
| Ex. 16 | C(=O)O | Cl | $CH_3$ | 355 |
| Ex. 17 | C(=O)O | Cl | $C_2H_5$ | 348 |
| Ex. 18 | C(=O)O | Cl | $CH_2CF_3$ | 422 |
| Ex. 19 | C(=O)O | Cl | $CH_2CCl_3$ | 570 |
| Ex. 20 | C(=O)O | Cl | $CH_2CBr_3$ | 595 |
| Ex. 21 | C(=O)O | Cl | $C_4F_9$ | 450 |
| Ex. 22 | C(=O)O | Cl | $CH_2CF_2CF_3$ | 460 |
| Ex. 23 | C(=O)O | F | $CH_2CCl_3$ | 480 |
| Ex. 24 | C(=O)O | Br | $CH_2CCl_3$ | 580 |
| Ex. 25 | C(=O)O | $CH_3$ | $CH_2CCl_3$ | 400 |
| Ex. 26 | $S(=O)_2O$ | H | $CH_3$ | 360 |
| Ex. 27 | $S(=O)_2O$ | H | $C_2H_5$ | 350 |
| Ex. 28 | $S(=O)_2O$ | H | $CH_2CF_3$ | 438 |
| Ex. 29 | $S(=O)_2O$ | H | $CH_2CCl_3$ | 550 |
| Ex. 30 | $S(=O)_2O$ | H | $CH_2CBr_3$ | 590 |

TABLE 6

|  | Conventional via-filling material | Etching rate (nm/min) |
|---|---|---|
| Com. Ex. 7 | PMMA resin | 174 |
| Com. Ex. 8 | DUV (available from Nissan Chemical Industries) | 142 |
| Com. Ex. 9 | AZ KrF-16 (available from Clariant Japan KK) | 140 |
| Com. Ex. 10 | KrF resist (PEK-112) | 138 |
| Com. Ex. 11 | Novolak resin (i-ray resist) | 105 |
| Com. Ex. 12 | Methoxymethylated benzoguanamine | 142 |

From comparison of Tables 4 to 6, the etching rate of the via-filling body obtained from the via-filling material of the present invention was found to be higher than etching rate of the insulating film used in the dual damascene process and the etching rate of the via-filling body obtained from the conventional via-filling material was found to be lower than the etching rate of the above insulating film.

The via-filling material of the present invention has the effect that the via-filling material does not protrude from the insulating film even when etched at the same time as the insulating film.

EXAMPLE 31

A semiconductor integrated circuit was fabricated using the via-filling material of the present invention by the dual damascene method and the generation of deposition after etching was examined.

The process for fabricating the semiconductor integrated circuit of this Example is described referring to FIG. 1.

First, lower insulating film 104 of SiOC of 800 nm in thickness was formed on semiconductor substrate 100 by the CVD (Chemical Vapor Deposition) method and a wiring trench was formed by a common photolithographic method. After a copper seed layer was formed by sputtering, by forming the first conductor by a copper plating process and further leveling by the CMP (Chemical Mechanical Polishing) method, a structure in which lower metal line 105 made from copper was embedded into lower insulating layer 104 was prepared. Also, etching stopper film 103 made of SiN was formed in a thickness of 60 nm by sputtering and upper insulating layer 102 was formed by the CVD method and leveled by the CMP method so that the thickness of insulating layer 102 became 1000 nm (FIG. 1(a)).

Next, resist pattern 101 was formed using a common photolithographic method (FIG. 1(b)), via hole 106 was formed by etching (FIG. 1(c)) and the resist pattern was removed (FIG. 1(d)).

Then, the 7% polymer solution described in Example 1 which is the via-filling material of the present invention was applied by spin coating to fill via hole 106 with via-filling material 117 and upper insulating film 102 was leveled (FIG. 1(e)).

The via-filling material 117 which was filled was solidified by pre-baking at 150° C. for 60 seconds and baking at 220° C. for 60 seconds and via-filling body 107 was formed. On this via-filling body 107, organic antireflection coating material (AZ-ArF: available from Clariant Japan KK) was applied by spin coating and antireflection coating 108 was formed by heating at 100° C. for 60 seconds (FIG. 1(f)). Resist material for ArF excimer laser (available from Tokyo Ohka Kogyo Co., Ltd) was applied and by processing with the usual photolithographic method, resist pattern 109 was formed (FIG. 1(g)).

Next, upper insulating film 102 and via-filling body 107 were subjected to plasma etching at the same time using etching gas of $C_4F_8/O_2/Ar=8/20/400$ sccm under the conditions of an RF power of 600 W and pressure of 30 mTorr and trench 110 of a depth of 600 nm was formed (FIG. 1(h)).

Then, resist pattern 109, antireflection coating 108 and via-filling body 107 remaining in the via hole were removed by an $O_2$ plasma ashing and amine type organic solvent and etching stopper film 103 made of SiN was exposed (FIG. 1(i)). At this point, via hole 106 was observed to find whether deposition due to etching had developed or not. In this Example, deposition had not developed and the via-filling material of the present invention was found to be particularly effective for preventing development of deposition in the etching step when preparing a semiconductor integrated circuit according to the dual damascene method.

The etching stopper film was then removed (FIG. 1(j)), copper was precipitated to via hole 106 and wiring trench 111 by copper sputtering and copper plating. Leveling was conducted by the CMP method to form upper metal line 113 and inter-layer connection 114 and semiconductor integrated circuit 115 was formed (FIG. 1(k)).

In the process for preparing the semiconductor integrated circuit of this Example, deposition did not develop in the opening part of the via hole and so faulty formation of the upper metal line did not occur. As a result, disconnection is prevented and a semiconductor integrated circuit with high reliability can be obtained.

EXAMPLES 32 to 45

A semiconductor integrated circuit was fabricated in the same manner as in Example 31 except that the via-filling material of the polymer described in Examples 2 to 15 was used instead of the via-filling material used in Example 31. After the step of FIG. 1(i), via hole 106 was observed to find whether deposition due to etching had developed or not.

In all of examples 32 to 45, deposition had not developed and the via-filling material of the present invention was found to be particularly effective for preventing development of deposition in the etching step when preparing a semiconductor integrated circuit according to the dual damascene method.

In the process for preparing the semiconductor integrated circuit of Examples 32 to 45, deposition did not develop in the opening part of the via hole and so faulty formation of the upper metal line did not occur. As a result, disconnection is prevented and a semiconductor integrated circuit with high reliability can be obtained.

COMPARATIVE EXAMPLES 13 to 18

A semiconductor integrated circuit was fabricated in the same manner as in Example 31 except that the conventional via-filling material described in Comparative Examples 1 to 6 was used instead of the via-filling material used in Example 31. After the step of FIG. 1(i), via hole 106 was observed to find whether deposition due to etching had developed or not.

Development of deposition was found in all of Comparative Examples 13 to 18. In other words, in the semiconductor integrated circuit prepared using the conventional via-filling material described in Comparative Examples 1 to 6, faulty formation of the upper metal line occurred and the semiconductor integrated circuit was not excellent in reliability.

EXAMPLE 46

A semiconductor integrated circuit was fabricated in the same manner as in Example 31 except that plasma etching was conducted using mixed etching gas of $CHF_3/CF_4/O_2/Ar=50/25/15/300$ sccm under the conditions of an RF power of 400 W and pressure of 45 mTorr in plasma etching in the step of FIG. 1(h) of Example 31. After the step of FIG. 1(i), via hole 106 was observed to find whether deposition due to etching had developed or not.

In the present Example, deposition did not develop. That is, the via-filling material of the present invention was found to be particularly effective for preventing development of deposition in the etching step when preparing a semiconductor integrated circuit according to the dual damascene method.

In the process for preparing the semiconductor integrated circuit of the present Example, deposition did not develop in the opening part of the via hole and so faulty formation of the upper metal line did not occur. As a result, disconnection is prevented and a semiconductor integrated circuit with high reliability can be obtained.

EXAMPLES 47 to 60

A semiconductor integrated circuit was fabricated in the same manner as in Example 46 except that the via-filling material of the polymer described in Examples 2 to 15 was used instead of the via-filling material used in Example 46. After the step of FIG. 1(i), via hole 106 was observed to find whether deposition due to etching had developed or not.

In all of Examples 47 to 60, deposition had not developed and the via-filling material of the present invention was found to be particularly effective for preventing development of deposition in the etching step when preparing a semiconductor integrated circuit according to the dual damascene method.

In the process for preparing the semiconductor integrated circuit of Examples 47 to 60, deposition did not develop in the opening part of the via hole and so faulty formation of the upper metal line did not occur. As a result, disconnection is prevented and a semiconductor integrated circuit with high reliability can be obtained.

COMPARATIVE EXAMPLES 19 to 24

A semiconductor integrated circuit was fabricated in the same manner as in Example 46 except that the conventional via-filling material described in Comparative Examples 1 to 6 was used instead of the via-filling material used in Example 46. After the step of FIG. 1(i), via hole 106 was observed to find whether deposition due to etching had developed or not.

Development of deposition was found in all of Comparative Examples 19 to 24. In other words, in the semiconductor integrated circuit prepared using the conventional via-filling material described in Comparative Examples 1 to 6, faulty formation of the upper metal line occurred and the semiconductor integrated circuit was not excellent in reliability.

EXAMPLE 61

The monomer represented by the above formula (2), in which X was —C(=O)O—, $R_1$ was Cl and $R_2$ was $CH_2CCl_3$, was used as the first monomer and allylester α-chloroacrylate was used as the second monomer. The two monomers were mixed and thermally polymerized by agitating at 150° C. for 10 hours. A copolymer with a composition ratio of $X_1/X_2$=80/20, that is copolymer 1 of Table 7, was obtained.

Using this copolymer 1, the via-filling material was prepared in the same manner as in Example 1 and applied to a silicon wafer. Then, a via-filling body of a thickness of 1,000 nm was formed by pre-baking at 150° C. for 60 seconds and baking at 220° C. for 60 seconds and sample A for measuring etching rate was prepared. Sample A which is the via-filling body film was subjected to plasma etching under the same conditions as in Example 1 and the etching rate was measured. The results are shown in Table 8 along with the compounding of the via-filling material except for the solvent.

On this via-filling body formed on the silicon wafer, organic antireflection coating material (ArF-1C1B: available from Clariant Japan KK) was applied by spin coating and an antireflection coating was formed by heating at 200° C. for 60 seconds to prepare sample B.

The silicon wafer of sample B was cut and the section was observed by a scanning electron microscope. Then, development of mixing was determined by whether a boundary existed between the via-filling body and the antireflection film. The results are shown in Table 8. Mixing was determined to have occurred, if the boundary has been lost in this observation.

EXAMPLES 62 to 65

The via-filling material was prepared in the same manner as in Example 61 except for respectively using copolymer 2, copolymer 3, copolymer 6 and copolymer 8 of which the first monomer, second monomer and composition ratio of the structural unit derived therefrom are as described in Table 7. Furthermore, sample A and sample B were prepared using this via-filling material and the etching rate of the via-filling body and development of mixing were evaluated in the same manner as in Example 61. The results are shown in Table 8 along with the compounding of the via-filling material except for the solvent.

EXAMPLES 66 and 67

The via-filling material was prepared in the same manner as in Example 61 except for respectively using copolymer 9 in which the composition ratio of the structural unit derived from the first monomer is 68% and copolymer 10 in which the composition ratio of the structural unit derived from the second monomer is 1.5%, both of which are shown in Table 7 and have the same first monomer and the second monomer as in the copolymer used in Example 61. Furthermore, sample A and sample B were prepared using this via-filling material and the etching rate of the via-filling body and development of mixing were evaluated in the same manner as in Example 61. The results are shown in Table 8 along with the compounding of the via-filling material except for the solvent.

TABLE 7

| | First monomer | | | | |
|---|---|---|---|---|---|
| | X | $R_1$ | $R_2$ | Second monomer | $X_1/X_2$ |
| Copolymer 1 | C(=O)O | Cl | $CH_2CCl_3$ | Allylester α-chloroacrylate | 80/20 |
| Copolymer 2 | C(=O)O | Cl | $CH_2CCl_3$ | Allylester α-chloroacrylate | 98/2 |
| Copolymer 3 | C(=O)O | Cl | $CH_2CCl_3$ | Allylester α-chloroacrylate | 70/30 |
| Copolymer 4 | C(=O)O | Cl | $CH_2CCl_3$ | Allylester α-chloroacrylate | 90/10 |
| Copolymer 5 | C(=O)O | Cl | $CH_2CCl_3$ | α-chloroacrylate | 80/20 |
| Copolymer 6 | C(=O)O | Cl | $CH_2CCl_3$ | Glycidylester α-chloroacrylate | 80/20 |
| Copolymer 7 | C(=O)O | Cl | $CH_2CF_3$ | Ethylene glycol monoacrylate | 80/20 |
| Copolymer 8 | S(=O)$_2$O | H | $CH_2CF_3$ | Isopropenyl α-chloroacrylate | 80/20 |
| Copolymer 9 | C(=O)O | Cl | $CH_2CCl_3$ | Allylester α-chloroacrylate | 68/32 |
| Copolymer 10 | C(=O)O | Cl | $CH_2CCl_3$ | Allylester α-chloroacrylate | 98.5/1.5 |

$X_1/X_2$ represents the composition ratio of copolymer

TABLE 8

|  | Via-filling material | Etching rate (nm/min) | Development of mixing |
|---|---|---|---|
| Ex. 61 | Copolymer 1 | 248 | None |
| Ex. 62 | Copolymer 2 | 325 | None |
| Ex. 63 | Copolymer 3 | 233 | None |
| Ex. 64 | Copolymer 6 | 238 | None |
| Ex. 65 | Copolymer 8 | 245 | None |
| Ex. 66 | Copolymer 9 | 200 | None |
| Ex. 67 | Copolymer 10 | 335 | Mixed |

As obvious from the results of Examples 61 to 67, the etching rate of a via-filling body, obtained from a via-filling material using a copolymer in which the composition ratio of the structural unit derived from the first monomer represented by the above formula (2) is 98 to 70%, was larger than the etching rate of the upper insulating film. In addition, a via-filling material, using a copolymer in which the composition ratio of the structural unit derived from the second monomer, which is an unsaturated compound having at least two unsaturated groups or a unsaturated compound having an epoxy group is at least 2%, formed a via-filling body in which mixing with the antireflection coating did not occur, even when an antireflection coating was applied and heated at a temperature of 180° C. or higher.

EXAMPLES 68 to 73

Sample A and sample B were prepared in the same manner as in Example 61 except that the via-filling material shown in Table 9 was used and regarding the via-filling body obtained from the via-filling materials, the etching rate and development of mixing were evaluated. The results are shown in Table 9 along with the compounding of the via-filling material except for the solvent.

EXAMPLE 74

Sample A and sample B were prepared in the same manner as in Example 61 except that a via-filling material, in which the ratio of the compound added and mixed to the copolymer was greater than 25% by weight in the above mixture, was used. Regarding the via-filling body obtained from the via-filling material, the etching rate and development of mixing were evaluated. The results are shown in Table 9 along with the compounding of the via-filling material except for the solvent.

As obvious from the results of Examples 68 to 74, when the via-filling material was a mixture obtained by adding a compound that reacts with a functional group of the second monomer capable of crosslinking the copolymer to a copolymer of a first monomer represented by the above formula (2) and a second monomer having an unsaturated group and a functional group capable of crosslinking the obtained copolymer, has a composition ratio of 98 to 70% of the structural unit derived from the first monomer of the copolymer and contains at most 25% by weight of the above compound, the etching rate of the via-filling body obtained from this via-filling material was larger than the etching rate of the upper insulating layer. Furthermore, in the via-filling body obtained from this via-filling material, mixing with the antireflection coating did not occur, even when an antireflection coating was applied and heated at a temperature of 180° C. or higher.

EXAMPLES 75 to 85

A semiconductor integrated circuit was fabricated in the same manner as in Example 31 except that the via-filling material described in Examples 61 to 65 and 68 to 73 was used instead of the via-filling material used in Example 31 and antireflection coating was formed by applying organic antireflection coating material (ArF-1C1B: available from Clariant Japan KK) by spin coating and heating at 200° C. for 60 seconds. After the step of FIG. 1(*i*), via hole 106 was observed to find whether deposition due to etching had developed or not.

In all of examples 75 to 85, deposition had not developed and the via-filling material of the present invention was found to be particularly effective for preventing development of deposition in the etching step when preparing a semiconductor integrated circuit according to the dual damascene method. Also, according to the via-filling material of the present invention, even when heating the antireflection coating at 180° C. or higher, mixing did not develop between antireflection coating 108 and via-filling body 107 and an accurate resist pattern 109 was formed.

In the process for preparing the semiconductor integrated circuit of Examples 75 to 85, because a via hole opening part with excellent dimensional accuracy was formed and deposition did not develop in the opening part of the via hole, faulty formation of the upper metal line did not occur. As a result, disconnection is prevented and a semiconductor integrated circuit with high reliability can be obtained.

TABLE 9

| | Via-filling material | | | | |
|---|---|---|---|---|---|
| | Copolymer (Cp) | Compound added (Cm) | Composition ratio (Cp/Cm) | Etching rate (nm/min) | Development of mixing |
| Ex. 68 | Copolymer 4 | Ethylene glycol diacrylate | 75/25 | 251 | None |
| Ex. 69 | Copolymer 4 | Ethylene glycol diacrylate | 95/5 | 268 | None |
| Ex. 70 | Copolymer 5 | Dimethoxymethylene urea | 75/25 | 221 | None |
| Ex. 71 | Copolymer 6 | Bisphenol A diglycidyl ether | 75/25 | 212 | None |
| Ex. 72 | Copolymer 7 | Hexakismethoxymethyl melamine | 75/25 | 220 | None |
| Ex. 73 | Copolymer 8 | Glycerin triacrylate | 75/25 | 229 | None |
| Ex. 74 | Copolymer 4 | Ethylene glycol diacrylate | 74/26 | 202 | None |

Cp/Cm represents the weight ratio of Copolymer Cp and Compound Cm added

INDUSTRIAL APPLICABILITY

The via-filling material of the present invention comprises as the repeat unit a polymer represented by the following formula (1).

wherein $R_1$ is a member selected from the group consisting of hydrogen atom, fluorine atom, chlorine atom, bromine atom and methyl group; $R_2$ is a member selected from the group consisting of hydrogen atom, $C_{1-3}$ alkyl group and $C_{1-4}$ alkyl group in which the hydrogen atom is substituted by at least one kind of atoms of fluorine, chlorine and bromine atom; and X is —C(=O)O— or —S(=O)$_2$O—. According to this, the via-filling material of the present invention has the effect of preventing the development of chemically stable and hard to remove deposition which forms around the protrusion of the via-filling body, as the via-filling body does not protrude from the insulating film, even when the via-filling body obtained by solidifying the above via-filling material and the insulating film are etched at the same time.

Also, the via-filling material of the present invention comprises a copolymer of a first monomer represented by the following formula (2):

wherein $R_1$ is a member selected from the group consisting of hydrogen atom, fluorine atom, chlorine atom, bromine atom and methyl group; $R_2$ is a member selected from the group consisting of hydrogen atom, $C_{1-3}$ alkyl group and $C_{1-4}$ alkyl group in which the hydrogen atom is substituted by at least one kind of atoms of fluorine, chlorine and bromine atoms; and X is —C(=O)O— or —S(=O)$_2$O—, and a second monomer which contains an unsaturated group which brings about a copolymerization reaction with the first monomer and a functional group capable of crosslinking the obtained copolymer. According to this, development of chemically stable and hard to remove deposition which forms around the protrusion of the via-filling body, can be prevented as the via-filling body does not protrude from the insulating film, even when the via-filling body obtained by solidifying the above via-filling material and the insulating film are etched at the same time. Furthermore, mixing of the antireflection coating and the via-filling body can be prevented, even when the antireflection coating applied on the via-filling body is heated at a temperature of at least 180° C. and a decrease in dimensional accuracy of the resist pattern caused by mixing of the antireflection coating with the via-filling body can be prevented.

In the process for preparing the semiconductor integrated circuit of the present invention, as the via-filling material to be filled in the via hole, a via-filling material, which comprises a polymer containing a repeat unit represented by the above formula (1) or a copolymer of a first monomer represented by the above formula (2) and a second monomer having a unsaturated group which brings about a copolymerization reaction with the first monomer and a functional group capable of crosslinking the obtained copolymer, is used. Therefore, even when the insulating film and the via-filling body obtained by solidifying the via-filling material are etched at the same time, the via-filling body does not protrude from the insulating film and deposition does not pile up, so a favorable trench can be formed, without etching downward into the insulating film being inhibited.

Also, the disadvantage of deposition remaining around the opening part of the via hole does not occur so the extra step of removing this chemically stable and hard to decompose deposition which may damage the wiring of the semiconductor integrated circuit becomes unnecessary. Furthermore, when a wiring trench is filled with a copper conductor, good metal line can be obtained and as a result, disconnection due to faulty formation of metal line is prevented and a semiconductor integrated circuit with high reliability can be obtained.

The invention claimed is:

1. A via-filling material filling a via hole when a trench, wider than the via hole, is formed by plasma etching an insulating film including the via hole, said via-filling material comprising a polymer containing a repeating unit represented by wherein
$R_1$ is a member selected from the group consisting of hydrogen, fluorine, chlorine, bromine, and methyl group;
$R_2$ is a member selected from the group consisting of hydrogen, a $C_{1-3}$ alkyl group, and a $C_{1-4}$ alkyl group in which the hydrogen is replaced by at least one of fluorine, chlorine and bromine; and
X is —S(=O)$_2$O—.

2. The via-filling material of claim 1, wherein said polymer has a weight average molecular weight of 1,000 to 200,000.

3. A via-filling material filling a via hole when a trench, wider than the via hole, is formed by plasma etching an insulating film including the via hole, said via-filling material comprising a polymer containing a repeating unit represented by wherein
- $R_1$ is a member selected from the group consisting of fluorine, chlorine, and bromine;
- $R_2$ is a member selected from the group consisting of hydrogen, a $C_{1-3}$ alkyl group, and a $C_{1-4}$ alkyl group in which the hydrogen is replaced by at least one of fluorine, chlorine, and bromine; and
- X is —C(=O)O—.

4. The via-filling material of claim 3, wherein said polymer has a weight average molecular weight of 1,000 to 200,000.

5. A via-filling material filling a via hole when a trench, wider than the via hole, is formed by plasma etching an insulating film including the via hole, said via-filling material comprising a polymer containing a repeating unit represented by wherein
- $R_1$ is a member selected from the group consisting of hydrogen, fluorine, chlorine, bromine, and methyl group;
- $R_2$ is a member selected from the group consisting of hydrogen, a $C_{2-3}$ alkyl group, and a $C_{1-4}$ alkyl group in which the hydrogen is replaced by at least one of chlorine and bromine; and
- X is —C(=O)O—.

6. The via-filling material of claim 5, wherein said polymer has a weight average molecular weight of 1,000 to 200,000.

* * * * *